United States Patent [19]

Mandell

[11] Patent Number: 4,829,299
[45] Date of Patent: May 9, 1989

[54] ADAPTIVE-FILTER SINGLE-BIT DIGITAL ENCODER AND DECODER AND ADAPTATION CONTROL CIRCUIT RESPONSIVE TO BIT-STREAM LOADING

[75] Inventor: Douglas E. Mandell, Menlo Park, Calif.

[73] Assignee: Dolby Laboratories Licensing Corporation, San Francisco, Calif.

[21] Appl. No.: 101,369

[22] Filed: Sep. 25, 1987

[51] Int. Cl.$^4$ ............................................... H03M 3/02
[52] U.S. Cl. ........................................ 341/77; 341/51;
341/128; 341/143; 341/146; 341/156; 332/11 D
[58] Field of Search ....... 340/347 AD, 347 M, 347 C,
340/347 NT; 375/25-28; 332/11 D; 341/51,
77, 128, 132, 143, 146, 156, 167

[56] References Cited

U.S. PATENT DOCUMENTS

| | | | |
|---|---|---|---|
| 3,857,111 | 12/1974 | Deschenes | 375/32 X |
| 4,493,091 | 1/1985 | Gundry . | |
| 4,507,791 | 3/1985 | Gundry . | |
| 4,673,916 | 6/1987 | Kitamura et al. | 340/347 SH |

FOREIGN PATENT DOCUMENTS

| | | |
|---|---|---|
| 84306849.5 | 4/1985 | European Pat. Off. . |
| 2128825A | 5/1984 | United Kingdom . |

OTHER PUBLICATIONS

"Companded Predictive Delta Modulation: A Low-cost Conversion Technique for Digital Recording" by Robert W. Adams(dbx Inc.), *J. Audio. Eng. Soc.*, vol. 32, No. 9, Sep. 1984, pp. 659-672.

*DataBook—Integrated Circuits for Linear Applications*, RCA, 1986, pp. 375-383.
*Principles of Digital Audio* by Ken C. Pohlman, Howard W. Sams & Co., Inc. 1985, pp. 126-129.
*Handbook for Sound Engineers* by Glen Ballou, Howard W. Sams & Co., Inc. 1987, pp. 620-623.
"An Audio Broadcast System Using Delta Modulation" by Kenneth Gundry, SMPTE Journal, Nov. 1985, pp. 1185-1985.
Dialog Search from Compendex and Inspec data bases on Dialog System on Jul. 23, 1987.

*Primary Examiner*—William M. Shoop, Jr.
*Assistant Examiner*—Garry J. Romano
*Attorney, Agent, or Firm*—Thomas A. Gallagher

[57] ABSTRACT

An adaptive single-bit encoder and decoder has its adaptive function determined by dynamically dividing the message frequency band into delta-sigma and delta modulation regimes of operation. IN a practical embodiment this is accomplished by varying the corner frequency of a variable-frequency low-pass filter in a leaky integrator so that below the corner frequency the operation is that of delta-sigma modulation and above the corner frequency the operation is that of delta modulation. An adaptation control circuit removes the clock signal component from the encoded bit stream to provide an analog signal representative of bit stream information or loading for use in generating the control signal. The analog signal is peak rectified, smoothed, and (optionally) non-linearly processed to provide the control signal.

27 Claims, 5 Drawing Sheets

FIG._5.
(FILTER 17)

FIG._4.
(FILTER 16)

ADAPTIVE-FILTER SINGLE-BIT DIGITAL ENCODER AND DECODER AND ADAPTATION CONTROL CIRCUIT RESPONSIVE TO BIT-STREAM LOADING

BACKGROUND OF THE INVENTION

The invention relates generally to adaptive "single-bit" (delta and delta-sigma modulation) digital encoding and decoding systems for high-quality audio signals in which the message frequency band extends from very low audio frequencies, in the order of 20 to 50 Hz, to about 15 kHz. However, the invention is not limited to such applications. In particular, the invention relates to such systems in which the adaptive function, by means of an adaptive filter, variably divides the message frequency band into delta and delta-sigma modulation regimes of operation. The invention also relates to a circuit for providing an adaptation control signal responsive to the information in the bit stream ("bit-stream loading").

A simple single-integration delta modulator is a type of single-bit digital encoder that encodes an audio signal as a series of ones and zeros in such a way that the average number of ones over a short period of time represents the instaneous slope of the audio signal. Each one-bit word of the bit stream tells the delta modulation decoder to take one step up or down to reconstruct the audio. The size of this step is a parameter of the design: small steps give small quantization errors but limit the maximum slope of the signal, and steps large enough to accommodate high-frequency high-level signals produce large quantization errors. An adaptive delta modulator changes the step size dynamically, attempting to provide an acceptable compromise between quantization-error level and high-frequency signal handling ability.

In a delta-sigma modulator, which is also a single-bit digital device, the average number of ones over a short period of time represents the audio signal itself instead of its slope. Thus, the delta-sigma modulator, unlike the delta modulator, has an overload characteristic that is independent of frequency. Adaptive delta-sigma modulation systems are also well known.

A common way to implement delta modulation encoders and decoders is to obtain the integration function by using a fixed-frequency low-pass filter having a corner (pole) frequency low in the message signal band (300 Hz in a prior art high-quality audio delta-modulation system). Such an arrangement is sometimes referred to as a "leaky integrator": below the corner (turnover) frequency of the filter (the "leak" frequency or "leak time constant"), the modulator acts as a delta-sigma modulator and, above the corner frequency, the modulator acts as a delta modulator. In adaptive systems, the gain of the fixed-frequency low-pass filter integrator is varied to achieve the adaptation. It appears that circuit designers have used leaky integrators for two principal reasons: a leaky integrator, unlike a pure integrator, does not require infinite gain at low frequencies; and a leaky integrator, unlike a pure integrator, quickly dissipates errors in the bit stream due to its relatively short time constant.

The invention recognizes that the division of the message signal band into delta modulation and delta-sigma modulation regimes of operation is desirable, but that further improvement in performance and simplicity of operation can be achieved by dynamically varying the frequency at which the message band is divided into the two regimes of operation. This is accomplished by dynamically varying the corner (pole) frequency of the leaky integrator as the adaptive parameter of the system and by allowing, under certain signal conditions, the corner frequency of the leaky integrator to assume frequencies relatively high in the message signal band.

In any adaptive single-bit digital encoding and decoding system, circuitry is required to determine the amount of adaptation needed at any given time. Many prior art adaptive delta modulators operate in the digital domain to determine the required adaptation, using various bit-counting algorithms and circuits to increase the step size when long strings of ones or zeros are encountered in the encoded digital audio bit stream. Other prior art delta-modulator adaptation-control circuits operate in the analog domain, typically employing techniques similar to those used in the control circuits of analog audio compressors and expanders, including the use of "speed-up" networks to minimize overload at the onset of transients. The control circuit of the present invention, although operating also in the analog domain, recognizes that the encoded digital bit stream carries audio information particularly well suited for adaptive control and that the audio information can be simply derived and processed as an analog signal for use as an adaptation control signal.

SUMMARY OF THE INVENTION

In accordance with one aspect of the invention, the adaptive function in a single-bit digital encoding and decoding system is provided by dynamically dividing the message frequency band into first and second regimes of operation in response to an adaptation control signal, the adaptation function in the portion of the message frequency band subject to the first regime of operation acting in the manner of delta-sigma modulation, and the adaptation function in the portion of the message frequency band subject to the second regime of operation acting in the manner of delta modulation. In a preferred embodiment, this is implemented by varying the low-pass filter corner frequency of a leaky integrator as opposed to prior art arrangements having a fixed-frequency low-pass filter and a variable-gain leaky integrator. Thus, the arrangement operates as a delta-sigma modulator below the filter corner frequency and a delta modulator above that frequency. The corner frequency of the variable low-pass filter, under certain signal conditions, assumes frequencies relatively high in the message frequency band in comparison to the low fixed corner frequencies (near the bottom of the message band) typically used in prior art leaky integrators.

According to this aspect of the present invention, a variable-frequency single-pole low-pass filter performs the adaptive function by adjusting the transition frequency between the delta and delta-sigma regimes in response to a control signal. There is no requirement to vary the gain of the integrator. Thus, the variable low-pass filter, or variable "leaky integrator," simply and inexpensively provides the delta-modulation integration function at frequencies above its variable cutoff frequency, thereby providing an integrator whose integration frequency changes but whose gain at frequencies below the filter cutoff frequency does not change. As the cutoff frequency shifts, the integration gain above the cutoff frequency changes due to the shifting of the single-pole low-pass filter characteristic, which rolls off at 6 dB/octave, in the preferred embodiment.

This novel arrangement is believed to provide improved signal-to-noise performance, particularly with respect to low-frequency noise in the presence of high-level high-frequency signals, by taking advantage of the characteristics of delta and delta-sigma modulators and demodulators in response to dynamically changing signal conditions. The arrangement also retains the advantage of the decreased sensitivity of leaky integrators to integration errors. In addition, in practical circuit implementations, since variable-frequency low-pass filters have constant gain at low frequencies and DC, offsets at the input of the adaptive filter circuit are not likely to cause audible thumps when the filter frequency changes rapidly.

In a preferred embodiment, the variable frequency low-pass filter is realized by placing broad-band negative feedback around an integrator whose gain can be varied. At frequencies where the forward gain through the integrator exceeds the feedback factor by a sufficient margin, the frequency response is the inverse of that of the feedback network—a flat response. At higher frequencies, the forward gain of the integrator is smaller than the feedback factor, and the overall response becomes that of the integrator. In this way the frequency at which the response changes from flat to integration changes as a function of the gain of the integrator: the circuit functions as a variable-frequency single-pole low-pass filter.

In a preferred embodiment, the circuit includes an additional shelving low-pass filter in cascade with the variable filter. This additional filter serves both as a fixed pre- (in the encoder) and de-emphasis (in the decoder) network, reducing the audibility of noise modulation, and as a second integrator, providing noise shaping and improving the idle pattern of the modulator. In addition, in the preferred embodiment of the encoder, a further shelving low-pass filter is located in the feedback loop to the input comparator for the purpose of additional noise shaping.

According to a second aspect of the invention, an adaptation control-signal generator measures the effective "bit-stream loading" to generate a control signal for adjusting the variable low-pass filter frequency. Bit-stream loading is an indicator of the amount of information carried in the encoded audio bit stream. The adaptation control-signal generator according to this invention operates in the analog domain to provide a simple, yet effective, means to maintain a high bit-stream loading. In addition, the adaptation control-signal generator of this aspect of the invention is inherently capable of quick response due to the nature of its rectifier and smoothing circuits, and does not need extra "speed-up" networks used in certain prior art adaptation circuits to minimize overload at the onset of transients. This aspect of the invention is also usable with conventional delta-modulation systems, including the aforementioned variable-gain, fixed-frequency leaky integrator arrangement.

Because a delta-modulation signal can be decoded using an integrator, the audio content of a delta-modulation bit stream can be thought of as the time-derivative of the decoded audio signal produced when that bit stream is integrated. The derivative of an audio signal is, of course, its slope. This aspect of the invention is based on the recognition that because an adaptive delta modulator adjusts step size in response to changes in slope (an ideal adaptive delta modulator, for example, always accommodates the slope of an applied audio signal), the audio content of the bit stream, an indicator of slope, is well suited for use in adjusting the slope handling ability of a delta modulation system or a hybrid delta/delta-sigma modulation system. As the audio content of the bit stream (the bit-stream loading) rises, it indicates the presence of more and more information in the bit stream and that the delta modulator is approaching slope overloading. Ideally, the information in the bit stream is maximized without slope overloading.

In accordance with the teachings of this aspect of the invention, the audio content of the bit stream is transformed to the analog domain, rectified and smoothed. Optionally, the rectified and smoothed signal is then applied to a non-linear circuit such as an exponentiator, square-law, or cube-law device, which provides the control signal to the adapting element in a feedback-loop arrangement. In some applications, the non-linear circuit may be omitted. Either with or without the non-linear circuit, an analog audio compressor-type action is achieved. With the non-linear circuit, as the bit-stream loading increases to higher and higher levels, the degree of adaptation increases at an ever increasing rate and approaches a finite limit analogous to pure limiting in a compressor. In the case in which the non-linear circuit is omitted, a constant compression ratio results, determined by the gain in the control circuit.

In a preferred embodiment of this aspect of the invention, the audio content of the bit stream can be transformed to the analog domain by applying the encoded bit stream to a fixed low-pass filter having a corner frequency just above the message frequency band, but below the clock frequency used to produce the bit stream, so that the clock signal component, at a frequency above the audio band, is removed. The filter output, an analog signal, is peak rectified, smoothed by a non-linear time constant and applied to the optional non-linear circuit for application to the control input of the variable low-pass filter. The filter cutoff frequency is a linear function of the applied control signal. As the peak bit-stream loading increases, the cutoff frequency of the variable lowpass filter increases.

DETAILED DESCRIPTION OF THE PREFERRED EMBODIMENTS

Figure 1:
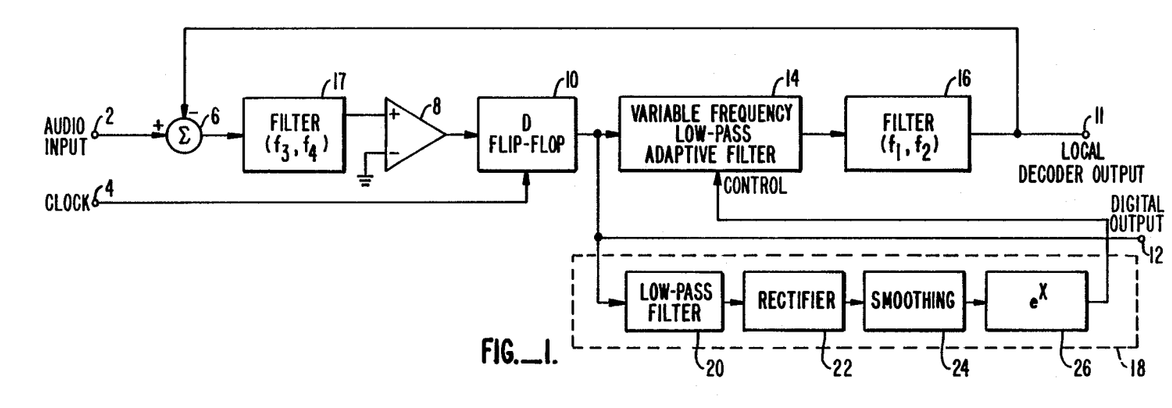
FIG. 1 is a functional block diagram of a preferred embodiment of the invention embodied in a modulator or encoder, incorporating both the first aspect of the invention, the variable-frequency low-pass adaptive filter, and the second aspect of the invention, the adaptation control-signal generator responsive to bit-stream loading.
Figure 2:
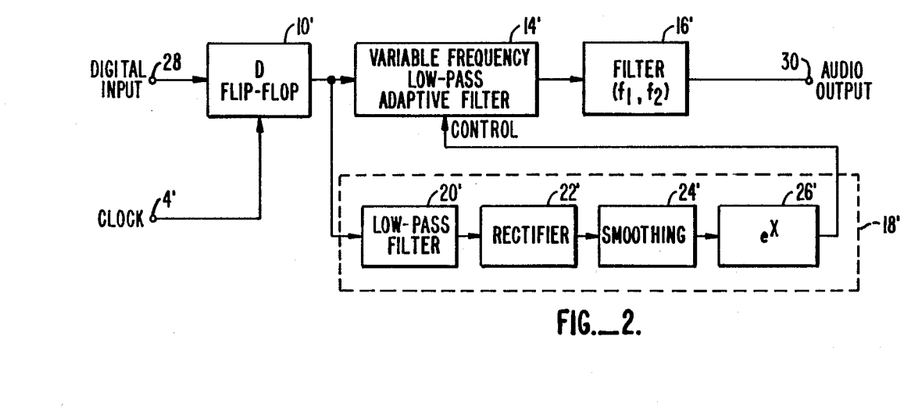
FIG. 2 is a functional block diagram of a preferred embodiment of the invention embodied in a demodulator or decoder.

Referring now to the drawings, FIG. 1 shows a functional block diagram of a preferred embodiment of the invention embodied in a modulator or encoder, incorporating both the first aspect of the invention, the variable-frequency low-pass adaptive filter, and the second aspect of the invention, the bit-stream loading responsive adaptation control-signal generator. FIG. 2 is a functional block diagram of a preferred embodiment of the invention embodied in a demodulator or decoder. Because the encoder includes the decoder, only the encoder of FIG. 1 will be described in detail. Corresponding functional elements of the decoder that are also present in the encoder generally are labeled with the same reference numeral but with a prime mark ("'") in the decoder of FIG. 2.

Referring to FIG. 1, the analog audio input is applied to input terminal 2 which is fed to a subtractor 6 that calculates the difference between the applied input audio signal and the reconstructed analog audio signal at the output of the encoder's local decoder. This difference is quantized to one of two binary levels by an operational-amplifier comparator 8 and is then time sampled by a D flip-flop 10 which is clocked by the clock input at terminal 4. The D flip-flop 10 provides the encoded digital signal output to output terminal 12 and to the variable-frequency low-pass filter 14. Subtractor 6, filter 17 (described below), comparator 8, and flip-flop 10 comprise digitizing means responsive to the two analog signals applied to subtractor 6 and to the clock sampling signal from terminal 4 applied to the flip-flop 10 for generating the digitally encoded output signal available at terminal 12; the output signal is a digital bit stream in which each single digital bit is responsive to a function (the filtered difference) of the two analog signals at each clock time.

Figure 3:
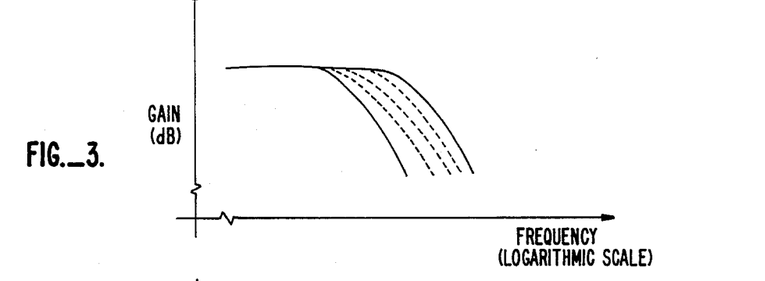
FIG. 3 shows a set of theoretical response curves (gain versus frequency (logarithmic scale)) for the variable-frequency filters 14 and 14' of FIGS. 1 and 2, respectively, showing, in solid lines, the quiescent low-frequency extreme position of the filters and the high-frequency extreme position of the filters, which is approached as a limit, and, in dashed lines, several examples of intermediate positions.

FIG. 3 shows a set of theoretical response curves for the variable-frequency filters 14 and 14', showing the low-frequency quiescent position and the high-frequency limiting position of the filter in solid lines and several examples of intermediate positions in dashed lines. The filter corner frequency, of course, may assume substantially an infinite number of positions in response to the DC control signal.

Figure 4:
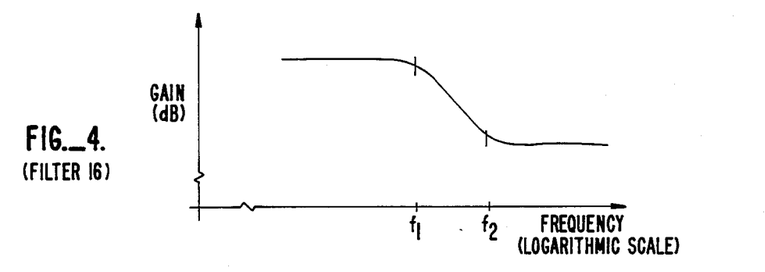
FIG. 4 shows the theoretical response curve for the single-pole low-pass shelving filters 16 and 16' of FIGS. 1 and 2, respectively.

The output of variable-frequency low-pass filter 14 is fed to a low-pass shelving filter 16 which provides the local analog decoder signal (available at terminal 11) for application to the inverting input of subtractor 6. Filter 16 provides a fixed pre-emphasis in the encoder; filter 16' provides a fixed de-emphasis in the decoder. Both filters 16 and 16' provide noise shaping and act as a second integrator. FIG. 4 shows the theoretical response curve for the low-pass single-pole shelving filters 16 and 16'. The break frequencies $f_1$ and $f_2$ of the shelf response are discussed below in connection with the practical embodiments of FIGS. 7 and 8. In the encoder of FIG. 1, the filter 16 provides a pre-emphasis effect because it is contained in the feedback loop applied to subtractor 6. Thus, in the encoder its response provides a boost rising at 6 dB/octave between $f_1$ and $f_2$, which is complementary to the response shown in FIG. 4. In the decoder of FIG. 2, the filter 16' provides a de-emphasis effect in accordance with the response shown, namely, a roll off falling at 6 dB/octave between $f_1$ and $f_2$.

Figure 5:
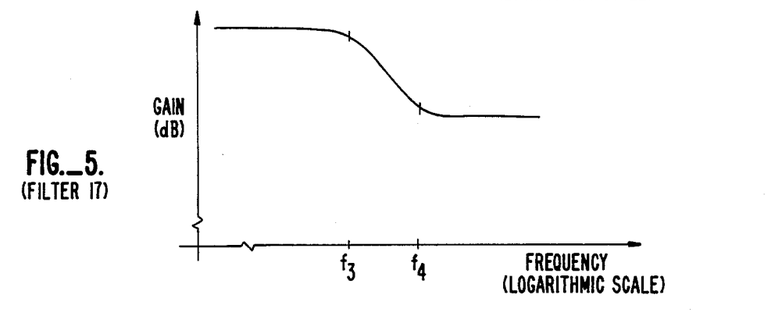
FIG. 5 shows the theoretical response curve for the single-pole low-pass shelving filter 17 of FIG. 1.
Figure 6:
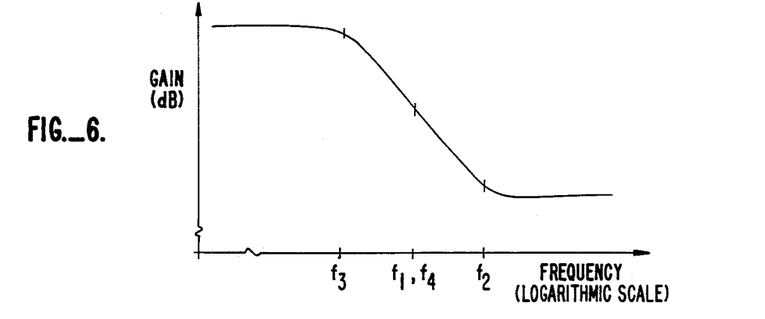
FIG. 6 shows the theoretical combined response curve for the single-pole low-pass shelving filters 16 and 17 of FIG. 1.

A further low-pass shelving filter 17 is provided in the encoder between subtractor 6 and comparator 8. Filter 17 provides additional noise shaping in the encoder, carrying the noise shaping down to a lower frequency than provided by filter 16. The placement of filter 17 is such that it has no effect on the preemphasis and has only a very small effect on the overload capability of the encoder. FIG. 5 shows the theoretical response curve for the low-pass shelving network 17. The break frequencies $f_3$ and $f_4$ of the filter 17 shelf response are discussed below in connection with the practical embodiments of FIGS. 7 and 8. Break frequency $f_1$ of filter 16 and break frequency $f_4$ of filter 17 are nearly the same. Thus, in the encoder, the cascade arrangement of filters 16 and 17 results in a combined response that is also a low-pass shelving characteristic. FIG. 6 shows the theoretical combined response curve for filters 16 and 17.

The digital bit stream from the D flip-flop 10 is also applied to the adaptation control signal generator 18 which applies a control signal to the variable-frequency filter 14 to control its corner (cutoff) frequency. The adaptation control signal generator 18 includes a low-pass filter 20, a full-wave peak-responding rectifier 22, a smoothing circuit 24, and (optionally) a non-linear circuit, a circuit embodying a function having a monotonically increasing slope, such as an exponentiating circuit 26. Although a square-law or cube-law circuit is suitable, in practice, an exponentiating circuit is used because such a circuit is easily implemented using bipolar transistors. Although improved performance is obtained when the optional non-linear circuit is used, in some applications it may be desirable to omit the non-linear circuit. In the decoder shown in FIG. 2, the digital input 28 accepts a digital signal such as provided at output 12 of the encoder of FIG. 1. The audio output signal at terminal 30 of the decoder is a close replica of the input signal at terminal 2 of the encoder of FIG. 1 when the decoder receives an encoded digital signal from the encoder of FIG. 1. A D flip-flop 10' is provided in the input of the decoder of FIG. 2 in order to provide a very clean digital bit stream to the adaptive filter 14'.

Figure 7:
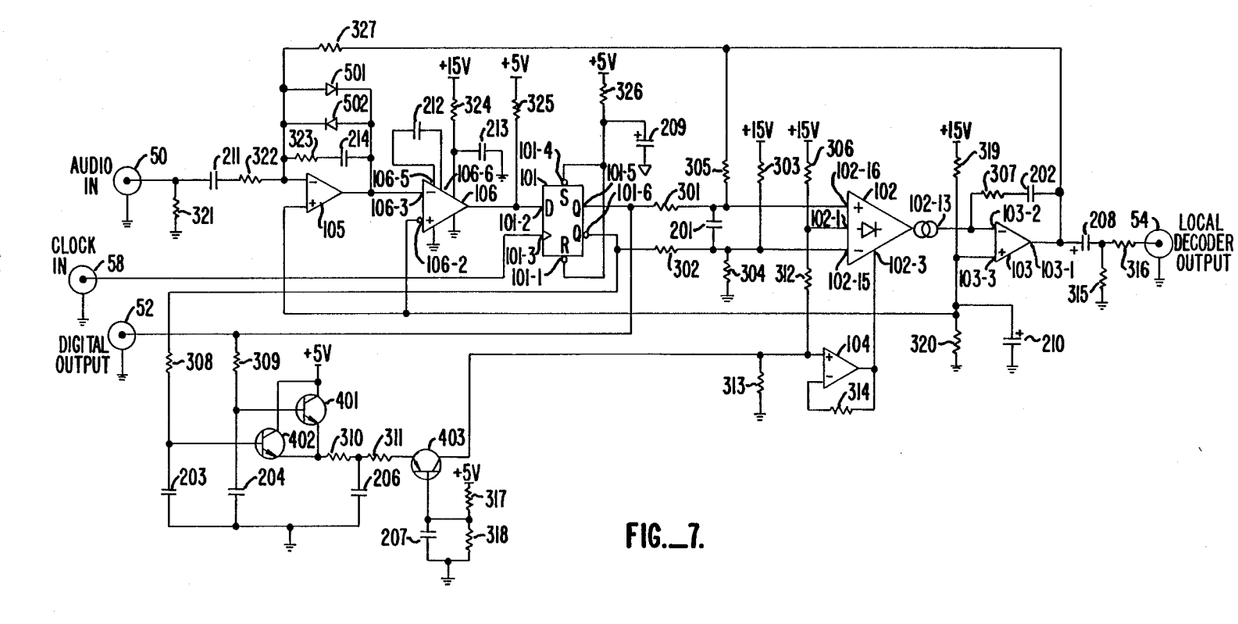
FIG. 7 is a schematic circuit diagram of a practical implementation of the preferred encoder embodiment.
Figure 8:
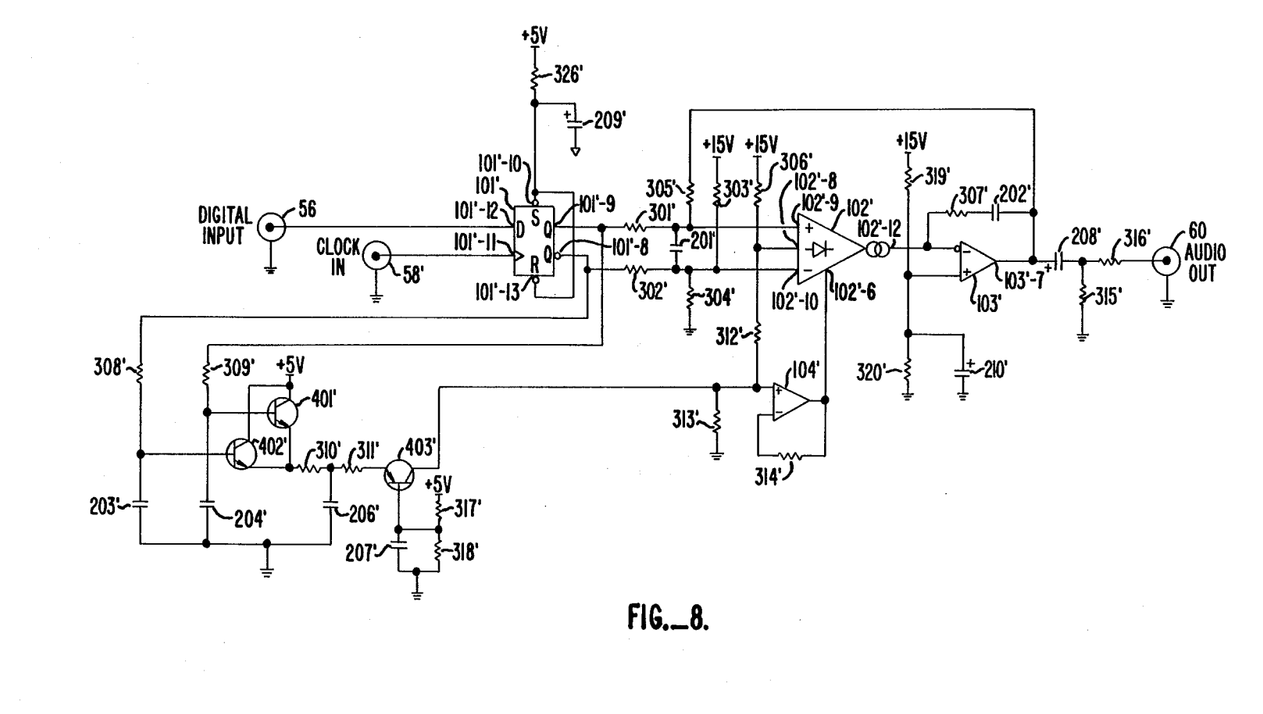
FIG. 8 is a schematic circuit diagram of a practical implementation of the preferred decoder embodiment.

FIGS. 7 and 8 are schematic circuit diagrams of practical implementations of the preferred embodiments of the encoder and decoder, respectively, which implement the functions described in connection with the embodiments of FIGS. 1 and 2. In the manner of FIGS. 1 and 2, only the encoder, FIG. 7, will be described in detail because it includes all of the elements of the decoder. Corresponding elements of the decoder that are also present in the encoder generally are labeled with the same reference numeral but with a prime mark in the decoder. Pin numbers of solid-state devices are designated by the reference number of the device, a hyphen and the pin number. Thus, for example pin 3 of the device 102 is designated as 102-3. The description of FIG. 7 begins with circuit elements common to the encoder and decoder.

Referring to FIG. 7, a single-pole low-pass variable-frequency filter is effectively in series with a low-pass shelving filter. The variable-frequency filter is implemented by a variable-gain integrator within a feedback loop. The variable-gain integrator includes a variable transconductance amplifier 102, driven at its positive and negative inputs, 102-16 and 102-15, respectively, by current source resistors 301 and 302 so as to operate as a variable current-gain amplifier. The variable-gain integrator also includes an operational amplifier 103, receiving the output of amplifier 102 from pin 102-13 of device 102 at its input pin 103-2, and a capacitor 202. The local decoder output, an analog signal, taken from the output pin 103-1 of device 103 is provided at output terminal 54. In the decoder, the analog output taken from the output pin 103'-7 of device 103,' is provided at output terminal 60. Capacitor 208 is a DC blocking capacitor. Resistor 315 provides a ground reference for the output coupling capacitor 208. Resistor 316 acts a stand-off resistor to isolate operational amplifier 103 from the output. Resistors 319 and 320 form a voltage divider to provide a +7.5 volt bias reference to pin 103-3 of device 103. Capacitor 210 bypasses pin 103-3 to ground.

In this practical implementation of the preferred embodiment, amplifier 102 preferably is one of two dual variable operational amplifiers contained on the RCA CA3280 integrated circuit chip. One of the two variable amplifiers may be used for the encoder while the other is used for the decoder. Such an arrangement is particularly useful when the encoder and decoder of the present invention are used, for example, in the same physical package to provide the digital signal for a digital delay line. In other applications, where the encoder and decoder are not on the same circuit board and do not share devices on the same integrated circuit chip, well-known component matching and temperature compensation techniques will likely be required. Also, the application and packaging of the practical implementation allows the use of a very high clock rate, in the order of 1 to 2 MHz. However, such a high clock rate is not critical to the invention.

The above mentioned feedback loop around the variable-gain integrator (from pin 103-1 of device 103 to the positive input pin 102-16 of device 102) that causes it to operate as a variable-frequency filter includes resistor 305. Capacitor 201 in parallel with the resistance of the internal linearizing diodes of amplifier 102 determines the pole of the low-pass shelving filter (corresponding to the break frequency $f_1$ of filter 16 of FIG. 1) and the combination of resistor 307 and capacitor 202 determine the zero (corresponding to the break frequency $f_2$ of filter 16). The resistance of the internal linearizing diodes of amplifier 102 is much smaller than the value of resistors 301 and 302. It is recognized that the pole determined by the internal linearizing diodes of amplifier 102 and capacitor 201 varies with signal level and temperature; however, in the practical implementation where the encoder and decoder are on the same printed circuit board and use two halves of the same integrated circuit device, there is very close tracking. In other applications, as mentioned above, additional component matching and temperature compensation may be necessary, using well-known techniques.

With very high clock rates in the order of 1 to 2 MHz, the zero (corresponding to the break frequency $f_2$ of filter 16) of the low-pass shelving network just described may be located above the audio spectrum, a zero frequency of about 20 to 30 kHz in this practical embodiment, allowing the full effect of the pre- and de-emphasis to be obtained. At lower clock rates, the zero must be moved down in frequency in order to keep the system stable.

Although the exact break frequency is not critical, in the practical implementation of the preferred embodiment, 6 kHz was chosen as the pole frequency (the lower break frequency, corresponding to $f_1$ of filter 16 in FIG. 1) of the pre and de-emphasis/noise shaping shelving network because it provides a reasonable compromise between adaptation range and signal handling capability. The rationale behind the choice of 6 kHz is based on the recognition that the spectral envelope of most music is such that, on the average, low-frequency components of music are at a higher level than high-frequency components and the components approximately follow a curve that rolls off at a 25 microsecond rate—a single-pole rolloff at 6 kHz. Thus, a pre-emphasis curve with a single pole at 6 kHz "pre-whitens" the music signal: it pushes up high-frequency components so that the resulting signal has approximately a white (flat) spectral balance. Although the pre-emphasis would appear to increase the probability of overload at high frequencies, this tends not to occur because most music does not contain high-level high-frequency components that would overload the system even after pre-emphasis.

In the practical embodiment, the variable-frequency low-pass filter has a corner frequency that approaches 6 kHz as a theoretical limit. Thus, the overall effect of that variable filter in cascade with the pre-emphasis/de-emphasis shelving network is a 2-pole roll off at frequencies above 6 kHz. While the 2-pole roll off provides a much better reduction in high-frequency noise modulation than does a single-pole roll off, it does adversely affect the high-frequency overload capability. However, this can be recovered by sacrificing some of the dynamic range, which is much more than adequate. The practical implementation of the invention has a dynamic range in excess of about 110 dB, thus allowing the high-frequency overload capability of a single-pole pre-emphasis to be regained by reducing the nominal input level to the circuit by the same amount as the additional boost at the top end of the audio spectrum (15 kHz); about 8 dB.

The feedback path including resistor 305 alters the mode of operation of the circuit, turning the variable-gain integrator into a variable-frequency integrator; without that feedback path the circuit would act as a conventional variable step-size delta modulator with additional noise shaping provided by the low-pass shelving network.

The turnover frequency at which the variable-frequency integrator switches from a delta modulator to a delta-sigma modulator changes with the adaptation control signal. The effect of capacitor 202 in the feedback path of operational amplifier 103 in cooperation with feedback applied around devices 102 and 103 provides the pole that forms the variable-frequency leaky integrator. Feedback applied around this network limits the low-frequency gain to a fixed value: at low frequencies when the loop gain through resistor 305, amplifier 102, and amplifier 103 is larger than unity, the frequency response is flat as determined by feedback resistor 305. At high frequencies when the loop gain falls below unity, the overall gain is essentially the open-loop gain because the contribution of resistor 305 becomes negligible. In that way, the result is a low-frequency pole that changes in frequency because the low-frequency gain remains constant and the amount of forward gain changes. The point at which the fixed gain caused by feedback intersects the changing open-loop gain causes the pole to move as the forward gain changes.

In this practical implementation of the preferred embodiment, the range of adaptation of the filter is limited such that the highest frequency that the filter can attain is approximately equal to the pole frequency of the shelving network. This provides a reasonable compromise between adaptation range and signal handling capability. If the pole frequency of the shelving network were lowered, then the maximum signal level curve would move down in frequency, thereby reducing the high-frequency signal handling capability relative to lower frequencies.

The circuit operates so that, on a steady-state basis, the variable-frequency filter corner frequency substantially matches the frequency of an applied sine wave at a maximum amplitude level. If the applied sine wave has an amplitude level less than the maximum level for which the circuit parameters are chosen, the filter corner frequency does not fully shift to the frequency of the sine wave but is lower in frequency; the filter adopts a corner frequency lower than the sine-wave frequency in order to provide sufficient encoder gain at the sine-wave frequency to maintain proper bit-stream loading.

A further advantage of this arrangement is the substantial elimination of audible "thumps" that occur in prior art variable step-size delta modulators, including not only those that use variable-gain integrators but also those in which pulse height is modulated. For example, in the arrangement of the present invention, the gain does not change at low frequencies and at DC; thus, there is no changing amplification of input offsets of a voltage-controlled element as there is in prior art variable-gain integrator type delta modulators. The circuit of the present invention may be built without any offset trims at the variable amplifier 102.

Referring again to FIG. 7, D flip-flop 101 receives the output of comparator 106 at its D input 101-2. In the decoder, D flip-flop 101' receives the digital input signal applied to terminal 56 at its D input 101'-12. Both flip-flops receive clock inputs from terminals 58 and 58' at their respective clock inputs 101-3 and 101'-11. As mentioned above, clock rates of about 1 to 2 MHz are suitable when the encoder and decoder are used in the environment of a digital audio delay line. However, much lower clock rates are usable for many applications and the clock rate is not critical to the invention. In this practical embodiment, both the encoder and decoder flip-flops 101 and 101' may be contained on a single integrated circuit chip, such as the 74HC74.

The adaptation control-signal generator circuit receives as inputs the digital audio bit stream from the true (Q) output 101-5 of flip-flop 101 (101'-9 in the decoder) and also the opposite polarity of that bit stream from the complement (not Q) output 101-6 (101'-8 in the decoder). In the encoder, the true (Q) output of flip-flop 101 provides the encoder digital output to output terminal 52. In both the encoder and decoder, the Q output bit stream is applied, along with the not Q output bit stream to respective RC low-pass pass filters, formed by resistor 308/capacitor 203, and resistor 309/capacitor 204. The corner frequency of the respective single-pole low-pass filters is at or somewhat above the upper limit of the audio band handled by the overall system. The low pass filters filter out the clock signal component to provide outputs that are continuous analog signals representing the two polarities of the encoded audio in the digital bit stream. In applications where a lower clock rate is used, it may be desirable to use second-order low-pass filters.

In this practical embodiment, the D flip-flops 101 and 101' are contained in the 74HC74 which is a CMOS device that provides +5 volts as its "1" output and ground as its "0" output; +5 volts is applied to the R and S inputs (101-1/101'-13 and 101-4 and 101'-10, respectively) of the encoder and decoder flip-flops 101 and 101'. Because the flip-flop outputs are used as analog signals, resistor 326 in series with the supply and capacitor 209 bypassed to ground are used to filter noise from the power source. When the digital output is a "1" the input to the resistor 309/capacitor 204 low-pass filter is +5 volts and the input to the other low-pass filter is at ground potential; when the digital output is "0," the situation is reversed. A main filter corner frequency of about 23 kHz is used in this practical implementation which is intended to handle signals as high as about 15 kHz.

Emitter-follower buffer transistors 401 and 402 function as half-wave rectifiers and also provide the OR function. The OR'ed output from the emitters of transistors 401 and 402 feeds a fast attack/slow decay smoothing circuit (charging resistor 310, capacitor 206, and discharging resistor 311) which in turn feeds common base buffer transistor 403.

The operation of this arrangement is best understood by way of example. Transistors 401 and 402, of course, will conduct when forward biased (base voltage exceeds emitter voltage) and will be cut off when reverse biased. Their respective emitter voltages are determined by the charge on smoothing capacitor 206. Buffers 401 and 402 charge capacitor 206 through resistor 310, in the manner of charging a capacitor through a diode. Capacitor 206 discharges only through resistor 311, which has a higher resistance than resistor 310; thus, it is a fast attack, slow decay circuit. In a practical implementation of this preferred embodiment, about a 10-1 decay to attack time ratio is used.

When the digital output from D flip-flop 101 is a steady-state alternating stream of ones and zeros, the capacitors in the low-pass filters will charge to about +2.5 volts, the average voltage of the flip-flop outputs, presenting that voltage to the bases of emitter followers 401 and 402. Both emitter followers will conduct until capacitor 206 is charged to a steady-state value of +2.5 volts (less the base-emitter voltage drop of transistors 401 and 402), at which point the emitter followers will cease to conduct. When the digital output from D flip-flop 101 changes to a string of ones, indicating a positive peak in the audio signal, the voltage applied to emitter follower 401 rises toward +5 volts causing it to conduct and charge capacitor 206 to a higher voltage thereby reverse biasing and cutting off emitter follower 402, whose input simultaneously falls toward zero volts. The reverse situation occurs as a result of a string of zeroes, indicating a negative peak in the audio waveform: emitter follower 402 conducts and the other is cut off. The output of emitter-follower buffers 401 and 402 thus follow the peaks of the filtered bit-stream signal. Capacitor 206 charges much faster than it discharges. The arrangement is non-linear in the sense that, if the voltage on the capacitor 206 is larger than the voltage at the bases of buffers 401 and 402, then both buffer 401 and buffer 402 will be cut off for a short period of time and the charging resistor is effectively disconnected. This condition occurs, for example, near the zero crossings of applied signals. The resulting operation is such that capacitor 206 is rapidly charged in response to peaks in the low-pass filtered bit stream.

Referring again to the low-pass filters feeding the emitter followers 401 and 402, various alternative arrangements are possible. For example, a further capacitor (not shown) may be connected between the base of emitter follower 401 and the base of emitter follower 402 to provide further smoothing.

Figure 9:
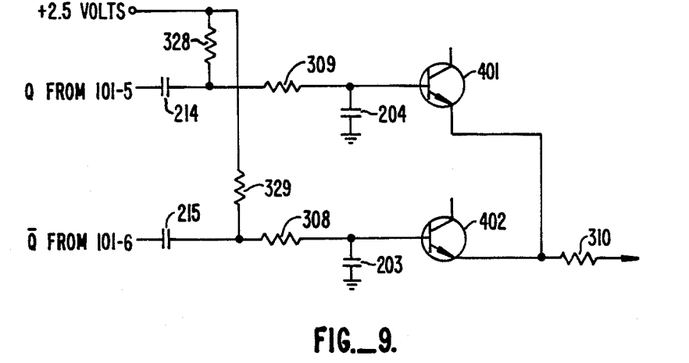
FIG. 9 is a schematic circuit diagram showing a modification to the control circuit portion of FIGS. 7 and 8.

Another alternative is to capacitively couple the outputs from the flip-flop to the low-pass filter and rectifier circuitry as shown in FIG. 9. Because the outputs of the D flip-flop 101 are not exactly complementary, as assumed above, there are small errors in the output of the flip-flop. This gives rise to small asymmetrical effects in the rectifier: negative peaks and positive peaks do not receive exactly the same gain. A way to overcome that problem is to couple the signals from flip-flop 101 through series capacitors 214 and 215 that block undesired asymmetrical offsets. Thus, only the AC component, the audio component, and not the DC component of the audio bit stream is received from the flip-flop 101. Because the series capacitors block DC, a bias reference voltage must be provided. In this practical embodiment, an appropriate reference voltage is +2.5 volts, the average flip-flop output voltage. Resistors 328 and 329 couple the reference voltage to the low-pass filters. The filter arrangement functions as a bandpass filter passing only audio frequencies.

The non-linear smoothing circuit feeds transistor 403, a common base buffer acting as a voltage-to-current converter and as a threshold circuit. Resistors 317 and 318 set a threshold above which the rectified current adjusts the position of the variable-frequency filter. Capacitor 207 is a bypass to ground. When the encoder and decoder are contained on the same printed-circuit board, a single set of components, capacitor 207 and resistors 317, 318, may be used to apply the bias voltage to transistors 403 and 403' in order to eliminate a possible source of error and to save cost. The adaptation control signal circuitry is also acted upon by an exponentiator function which is described below.

As mentioned above, in this practical implementation of the preferred embodiment, the variable transconductance amplifier 102 is preferably one of the two operational amplifiers contained on the RCA CA3280 integrated circuit chip. This operational amplifier contains two identical current mirror inputs: one, pin 102-1, provides bias current to the input linearizing diodes, and the other, pin 102-3, drives the main amplifier. A current mirror has an input impedance characteristic that closely resembles two diodes in series; if it is driven from a voltage source having an output impedance that is small with respect to the dynamic impedance of this virtual pair of diodes, the resulting input current is an exponential function of the applied voltage. In the present circuit, one of the two current mirrors, the one (pin 102-1) that controls the input linearizing diodes, is fed through a relatively high impedance, resistor 306, from the positive supply voltage (+15 volts), providing a constant bias current for the input diodes. The voltage at this current mirror input also supplies a reference voltage to the buffer amplifier circuit comprised of operational amplifier 104 and its feedback resistor 314.

Resistors 312 and 313 determine the fraction of this reference voltage that drives the main amplifier current mirror in the absence of rectifier output current from transistor 403 in the adaptation control signal generator circuit. This reference voltage fraction controls the quiescent or lowest frequency of the variable-frequency filter. Using well-known techniques, appropriate temperature compensation for the quiescent position may be provided. Resistors 303 and 304 between the +15 volt supply and ground provide a DC bias source for pin 102-15 of the device 102. The resistance of the parallel combination of resistors 303 and 304 matches the resistance of resistor 305 to balance the inputs to device 102.

As rectifier current from transistor 403 causes the voltage at the input of operational amplifier 104 to rise, the current into the main amplifier current mirror input (pin 102-3) increases as an exponential function of this rectifier current, and the filter corner frequency shifts upward in frequency. Because the exponentiator is a non-linear circuit in series with the feedback loop of the control circuit, it causes more and more loop gain to be applied as the signal level rises. As the bit-stream loading increases, the compression ratio increases so that at sufficiently high bit-stream loading levels it acts in the manner of an automatic gain control circuit with an infinite compression slope. At low levels, the compression slope is relaxed, reducing the chance of mistracking.

The decoder also uses all of the circuitry described so far, but the encoder requires some additional circuitry: operational amplifier 105 functions as a subtractor, calculating the difference between the applied input audio signal and the reconstructed audio at the output of the encoder's local decoder. This difference is quantized to one of two binary levels by comparator 106, and is then time sampled by D flip-flop 101. Diodes 501 and 502 in the feedback path of the operational-amplifier subtractor 105, maintain stability in the case of overload by limiting the difference signal. The analog audio input to the encoder is applied at input 50 which couples the signal to summing resistor 322 connected to the negative input of the operational amplifier 105. Capacitor 211 is a DC blocking capacitor and resistor 321 provides a ground reference for capacitor 211. The reconstructed audio signal from operational amplifier 103 is applied to the subtractor 105 through summing resistor 327. The polarity of the reconstructed audio signal with respect to the input audio signal results in subtraction.

Comparator 106 compares the difference signal from subtractor 105 at its negative input 106-3 to a reference voltage at its positive input 106-2. Resistors 324, 325 and capacitors 212, 213 relate to details of the practical implementation which employs an LM311 device as the comparator 106. Pins 106-5 and 106-6 of the LM311 are trim pins; connecting capacitor 212 across those pins bypasses internal nodes in the LM311 chip so as to provide greater stability and less tendency to oscillate. Resistor 324 and capacitor 213 provide an RC bypass network that isolate noise generated in the comparator from entering the +15 volt power supply. Resistor 325 between the comparator output and the +5 volt supply is a pull-up resistor.

The noise-shaping characteristic of the low-pass shelving network corresponding to filter 16 of FIG. 1 can by improved by extending its low-frequency response. This is accomplished by providing an RC network, resistor 323 and capacitor 214, in the feedback path of the operational-amplifier subtractor 105. This provides a shelving network whose pole frequency (corresponding to break frequency $f_3$ of filter 17 of FIG. 1) equals that of the open-loop response of amplifier 105, about 50 to 100 Hz. Resistor 323 and capacitor 214 provide the zero (corresponding to break frequency $f_4$ of the shelving network, about 6 kHz. By locating the pole and zero creating elements at this point in the circuit rather than at the output (in association with operational amplifier 103), only the noise shaping characteristics and not the pre-emphasis are affected; thus the overload margin of the circuit is substantially unaffected.

The discussion of the circuit operation thus far has considered mainly steady-state rather than dynamic operation. Because the arrangement of the present invention is an output-controlled feedback-loop system, it is susceptible to many of the same dynamic signal effects as audio signal compressors and expanders, for example, signal overshoots in compressors and signal undershoots in expanders. If an audio signal with a rapidly rising envelope is applied to the encoder of the present invention, the headroom provided above the steady-state adaption level determines how much level is available for the system to overshoot without overloading the bit stream. Adjusting the threshold in the adaptation-level control-signal path (resistors 317 and 318) allows selection of the amount of headroom between the value of the steady-state adaptation level and the overload point of the bit stream.

Ideally, the delta modulator as described operates to optimize the bit-stream loading. That is, the variable-frequency low-pass filter corner frequency is selected so as to maximize the information in the bit stream without overloading or clipping. When the bit stream overloads it puts out long streams of ones or zeros, indicating that it is slewing as far positive or negative as possible. Under these conditions, the low-pass filtered bit stream has the appearance of a clipped waveform, e.g. a straight horizontal line, either positive or negative. If such a clipped signal is applied, for example, to a fixed-gain integrator, the integrator output is a constantly rising or falling voltage—it is slew rate limited. By adjusting the attack time of the non-linear smoothing network (resistor 310 and capacitor 206 in the adaptation level control signal circuit), the attack time of the system can be set so as to prevent the overshoot from exceeding a maximum magnitude. Adjustment of that attack time along with steady-state adaptation level allows the system to accommodate likely overshoots without overloading or clipping the bit stream excessively.

In the practical implementation of the preferred embodiments of the encoder and decoder, as shown in FIGS. 7 and 8, the following parts values and components were used. Where not indicated, the values for elements in the decoder corresponding to those in the encoder are the same.

| | |
|---|---|
| Operational amplifier 105 | TL074 |
| Comparator 106 | LM311 |
| Flip-flop 101 | 74HC74 |
| Variable amplifier 102 | RCA CA3280 |
| Resistor 301 | 4.7 kilohm |
| Resistor 302 | 4.7 kilohm |
| Resistor 303 | 20 kilohm |
| Resistor 304 | 20 kilohm |
| Resistor 305 | 10 kilohm |
| Resistor 306 | 10 kilohm |
| Resistor 307 | 3.6 kilohm |
| Resistor 308 | 10 kilohm |
| Resistor 309 | 10 kilohm |
| Resistor 310 | 1 kilohm |
| Resistor 311 | 10 kilohm |
| Resistor 312 | 15 kilohm |
| Resistor 313 | 30 kilohm |
| Resistor 314 | 10 kilohm |
| Resistor 315 | 47 kilohm |
| Resistor 316 | 100 ohms |
| Resistor 317 | 44.2 kilohm |
| Resistor 318 | 52.3 kilohm |
| Resistor 319 | 10 kilohm |
| Resistor 320 | 10 kilohm |
| Resistor 321 | 47 kilohm |
| Resistor 322 | 10 kilohm |
| Resistor 323 | 39 kilohm |
| Resistor 324 | 100 ohms |
| Resistor 325 | 1 kilohm |
| Resistor 326 | 100 ohms |
| Resistor 327 | 10 kilohm |
| Capacitor 201 | 470 nanofarads |
| Capacitor 202 | 2.2 nanofarads |
| Capacitor 203 | 680 picofarads |
| Capacitor 204 | 680 picofarads |
| Capacitor 206 | 1.0 microfarads |
| Capacitor 207 | 100 nanofarads |
| Capacitor 208 | 10 microfarads |
| Capacitor 209 | 10 microfarads |
| Capacitor 210 | 220 microfarads |
| Capacitor 211 | 1.0 microfarads |
| Capacitor 212 | 100 nanofarads |
| Capacitor 213 | 100 nanofarads |
| Capacitor 214 | 680 picofarads |

I claim:

1. An adaptive single-bit digital encoder operating in a message frequency band for generating a digitally encoded output signal representative of and in response to an analog input signal and a clock sampling signal, said encoder comprising:

digitizing means responsive to first and second analog signals and to said clock sampling signal for generating said digitally encoded output signal, wherein said output signal is a digital bit stream in which each single digital bit is responsive to a function of the first and second analog signals at each clock sampling signal sample time, means for coupling said analog electrical input signal to said digitizing means as said first analog signal, control signal generating means responsive to said digital bit stream for generating an adaptation control signal, adaptation means responsive to said digitally encoded output signal for dynamically dividing the message frequency band into first and second regimes of operation in response to said adaptation control signal, the adaptation means in the portion of the message frequency band subject to said first regime of operation acting on said digitally encoded output signal in the manner of delta-sigma modulation, and the adaptation means in the portion of the message frequency band subject to said second regime of operation acting on said digitally encoded output signal in the manner of delta modulation to produce an analog signal, and means for coupling the analog signal produced by the adaptation means to said digitizing means as said second analog signal.

2. An encoder according to claim 1 wherein the first regime of operation of said adaptation means operates at lower frequencies of the message frequency band than the second regime of operation.

3. An encoder according to claim 1 wherein said adaptation means in the portion of the message frequency band subject to said first regime of operation acts in the manner of the passband of a low-pass filter, and wherein said adaptation means in the portion of the message frequency band subject to said second regime of operation acts in the manner of an integrator.

4. An encoder according to claims 1, 2 or 3 wherein said adaptation means comprises a variable-frequency low-pass filter, wherein the corner frequency of the low-pass filter is responsive to said adaptation control signal, whereby the portion of the message frequency band below the corner frequency of the filter is in the filter passband and the portion of the message frequency band above the corner frequency filter is rolled off to provide an integration function.

5. An encoder according to claim 4 wherein said low-pass filter is a single-pole filter.

6. An encoder according to claims 1, 2, or 3 wherein said control signal generating means comprises
means for removing the clock sampling signal component from said digital bit stream to provide an analog signal representative of the information in said digital bit stream,
means for rectifying said analog signal derived from the digital bit stream, and
means for smoothing said rectified signal.

7. An encoder according to claim 6 wherein said control signal generating means further comprises means for non-linearly processing said smoothed signal.

8. An encoder according to claim 6 wherein said means for rectifying comprises a peak-responding rectifier.

9. An encoder according to claim 6 wherein said means for smoothing includes a time-constant circuit having a fast charge and slow discharge time.

10. An encoder according to claim 6 wherein said means for non-linearly processing said smoothed signal comprises an exponentiating circuit.

11. An encoder according to claims 1, 2, or 3 wherein said means for coupling the analog signal produced by the adaptation means to said digitizing means includes a noise-shaping filter.

12. An encoder according to claim 11 wherein said noise-shaping filter also functions as a second integrator and as a pre-emphasis network.

13. An encoder according to claim 11 wherein said noise-shaping filter has the characteristics of a low-pass shelving network.

14. An encoder according to claim 13 wherein said digitizing means includes a further noise-shaping filter.

15. An encoder according to claim 14 wherein said further noise-shaping filter also has the characteristics of a low-pass shelving network, the characteristics of said further noise-shaping filter acting to extend the low-frequency response of said other noise-shaping filter.

16. An adaptive single-bit digital decoder operating in a message frequency band for generating an analog output signal representative of and in response to a digitally encoded input signal, said decoder comprising:
control signal generating means responsive to a digital bit stream for generating an adaptation control signal,
adaptation means responsive to a digital bit stream for dynamically dividing the message frequency band into first and second regimes of operation in response to said adaptation control signal, the adaptation means in the portion of the message frequency band subject to said first regime of operation acting on said digital bit stream in the manner of delta-sigma modulation, and the adaptation means in the portion of the message frequency band subject to said second regime of operation acting on said digital bit stream in the manner of delta modulation to produce an analog signal,
means for coupling said digitally encoded input signal to said control signal generating means and to said adaptation means as said digital bit stream,
output means for providing said analog output signal, and
means for coupling the analog signal produced by the adaptation means to said output means.

17. A decoder according to claim 16 wherein the first regime of operation of said adaptation means operates at lower frequencies of the message frequency band than the second regime of operation.

18. A decoder according to claim 16 wherein said adaptation means in the portion of the message frequency band subject to said first regime of operation acts in the manner of the passband of a low-pass filter, and wherein said adaptation means in the portion of the message frequency band subject to said second regime of operation acts in the manner of an integrator.

19. A decoder according to claims 16, 17, or 18 wherein said adaptation means comprises a variable-frequency low-pass filter, wherein the corner frequency of the low-pass filter is responsive to said adaptation control signal, whereby the portion of the message frequency band below the corner frequency of the filter is in the filter passband and the portion of the message frequency band above the corner frequency filter is rolled off to provide an integration function.

20. A decoder according to claim 19 wherein said low-pass filter is a single-pole filter.

21. A decoder according to claims 16, 17, or 18 wherein said control signal generating means comprises
means for removing the clock sampling signal component from said digital bit stream to provide an analog signal representative of the information in said digital bit stream,
means for rectifying said analog signal derived from the digital bit stream,
means for smoothing said rectified signal.

22. A decoder according to claim 21 wherein said control signal generating means further comprises means for non-linearly processing said smoothed signal.

23. A decoder according to claim 21 wherein said means for rectifying comprises a peak-responding rectifier.

24. A decoder according to claim 21 wherein said means for smoothing includes a time-constant circuit having a fast charge and slow discharge time.

25. A decoder according to claim 21 wherein said means for non-linearly processing said smoothed signal comprises an exponentiating circuit.

26. A decoder according to claims 16, 17, or 18 wherein said means for coupling the analog signal produced by the adaptation means to said output means includes a de-emphasis network.

27. A decoder according to claim 26 wherein said de-emphasis network has the characteristics of a low-pass shelving network.

* * * * *

UNITED STATES PATENT AND TRADEMARK OFFICE
CERTIFICATE OF CORRECTION

PATENT NO. : 4,829,299

DATED : May 9, 1989

INVENTOR(S) : Douglas E. Mandell

It is certified that error appears in the above-identified patent and that said Letters Patent is hereby corrected as shown below:

On the title page:

Abstract, Line 4: "IN" should be --In--

Column 1, Line 26: "instaneous" should be --instantaneous--

Column 7, Line 16: "103,'" should be --103',--

Signed and Sealed this

Seventeenth Day of July, 1990

Attest:

HARRY F. MANBECK, JR.

*Attesting Officer*  *Commissioner of Patents and Trademarks*